(12) United States Patent
Dijksman et al.

(10) Patent No.: US 10,222,693 B2
(45) Date of Patent: Mar. 5, 2019

(54) IMPRINT LITHOGRAPHY ALIGNMENT METHOD AND APPARATUS

(75) Inventors: Johan Frederik Dijksman, Weert (NL); Anke Pierik, Veldhoven (NL); Sander Frederik Wuister, Eindhoven (NL); Roelof Koole, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1076 days.

(21) Appl. No.: 13/189,145

(22) Filed: Jul. 22, 2011

(65) Prior Publication Data

US 2012/0021140 A1 Jan. 26, 2012

Related U.S. Application Data

(60) Provisional application No. 61/367,760, filed on Jul. 26, 2010.

(51) Int. Cl.
*G03F 7/00* (2006.01)
*B82Y 10/00* (2011.01)
*B82Y 40/00* (2011.01)

(52) U.S. Cl.
CPC ............ *G03F 7/0002* (2013.01); *B82Y 10/00* (2013.01); *B82Y 40/00* (2013.01)

(58) Field of Classification Search
USPC .......................................................... 427/64
See application file for complete search history.

(56) References Cited

U.S. PATENT DOCUMENTS 3,984,680 A * 10/1976 Smith .............................. 378/34
4,327,292 A * 4/1982 Wang et al. ................ 250/491.1
4,731,155 A     3/1988 Napoli et al.
5,772,905 A     6/1998 Chou
6,297,294 B1 * 10/2001 Lazaar ............................ 522/79
6,334,960 B1    1/2002 Willson et al.
(Continued)

FOREIGN PATENT DOCUMENTS

WO        02/067055        8/2002

OTHER PUBLICATIONS

Jan Haisma et al., "Mold-assisted nanolithography: A process for reliable pattern replication," J. Vac. Sci. Technol., vol. B14, No. 6, pp. 4124-4128 (Nov./Dec. 1996).

*Primary Examiner* — Robert A Vetere
(74) *Attorney, Agent, or Firm* — Pillsbury Winthrop Shaw Pittman LLP

(57) ABSTRACT

A method of aligning a template and a substrate for imprint lithography involves using a mask pattern of the template and a luminescent marker pattern of the substrate, the method including aligning the template mask pattern and the substrate marker pattern using a radiation intensity measurement of radiation emitted by the luminescent marker pattern and having passed the template mask pattern. The mask pattern and the luminescent marker pattern may each be shaped to provide a turning point in the intensity of detected radiation emitted from the marker pattern, and passing through the mask pattern to a detector, as a function of relative displacement at the aligned position. The displacement of the template and substrate may be aligned by identifying the turning point in radiation intensity. The marker pattern may be fluorescent with the emitted radiation excited by a radiation source.

20 Claims, 3 Drawing Sheets

(56) References Cited

U.S. PATENT DOCUMENTS

| | | | |
|---|---|---|---|
| 2002/0034209 A1* | 3/2002 | Ershov et al. | 372/103 |
| 2002/0095127 A1* | 7/2002 | Fish et al. | 604/368 |
| 2004/0124566 A1 | 7/2004 | Sreenivasan et al. | |
| 2005/0274693 A1 | 12/2005 | Heidari et al. | |
| 2007/0266875 A1* | 11/2007 | Berge | 101/481 |
| 2010/0183880 A1* | 7/2010 | Ogawa | 428/414 |

* cited by examiner

IMPRINT LITHOGRAPHY ALIGNMENT METHOD AND APPARATUS

This application claims priority and benefit under 35 U.S.C. § 119(e) to U.S. Provisional Patent Application No. 61/367,760, entitled "Imprint Lithography Alignment Method and Apparatus", filed on Jul. 26, 2010. The content of that application is incorporated herein in its entirety by reference.

FIELD

The present invention relates to an imprint lithography alignment method and apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface, to adopt the topography of that patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation such as UV radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets (e.g. deposited by ink jet printing) on the surface of a substrate to be patterned, but may alternatively be provided using spin coating or the like.

In some instances, imprint lithography may be used to imprint a pattern onto a substrate which has previously received a pattern (or more than one pattern). Where this is the case, it is desirable to align the patterned surface of the imprint template with the pattern already present on the substrate. One way in which this may be achieved uses alignment marks provided on the imprint template and on the substrate. The relative positions of the imprint template alignment marks and the substrate alignment marks are measured using one or more detectors. The substrate (and/or the imprint template) is then moved with respect to the imprint template (or with respect to the substrate) until the substrate and the imprint template are aligned with respect to each other. The imprint template alignment marks and the substrate alignment marks may be diffraction gratings. Where this is the case, separate diffraction gratings and associated detectors may be conventionally provided for alignment in the x and y directions (according to convention, the Cartesian x and y directions lie parallel to the surface of the substrate and are mutually orthogonal).

SUMMARY

It is desirable, for example, to provide accurate alignment methods and apparatuses for use in imprint lithography for device manufacture. It is desirable, for example, to provide an imprint lithography method and apparatus which allows for accurate alignment of substrate and imprint template without the need for high intensity lasers or diffraction gratings to obtain nanometer precision.

A first aspect provides a method of aligning a template and a substrate for imprint lithography using a mask pattern of the template and a luminescent marker pattern of the substrate, the method comprising aligning the mask pattern and the luminescent marker pattern using a radiation intensity measurement of radiation emitted by the luminescent marker pattern and having passed the mask pattern.

Throughout this specification, the term "template" means imprint template.

The luminescent marker pattern may be on a substrate surface and the mask pattern on a template surface, with the method comprising bringing the template surface and substrate surface together, with the template surface and substrate surface substantially mutually parallel to a plane, so that first radiation emitted from the luminescent marker pattern is arranged to pass through the mask pattern to a detector configured to measure the intensity of detected first radiation, and adjusting relative displacement of the template surface and substrate surface to an aligned position, by identification of a turning point in the intensity of detected first radiation as a function of the relative displacement of the template surface and substrate surface at the aligned position, wherein the mask pattern and the luminescent marker pattern are each shaped to provide a turning point in the intensity of detected first radiation as a function of relative displacement, at the aligned position.

The luminescent marker pattern and the mask pattern may be first, or concurrently, roughly aligned by imaging and then identification of the turning point obtained by measuring the intensity of detected radiation as a function of the relative displacement of the template surface and substrate surface as the template surface and/or substrate surface are moved relative to each other, substantially parallel to the plane, by an actuator.

It is to be understood that the template surface and/or substrate surface may not necessarily be completely flat or indeed planar (for instance the template surface may be slightly convex to assist with squeezing the imprint medium between the template surface and the substrate surface).

By bringing the substrate surface and template surface together, it is meant that the faces will typically be brought to a position wherein they are spaced apart by less than 100 nm, such as from 20 to 50 nm, and the liquid imprint medium may be present—squeezed between them.

The luminescent marker pattern may be a simple shape such as a disc, but may also be a complex, 2-dimensional pattern such as an array of spaced lines. A plurality of luminescent marker patterns may be employed, each having a corresponding mask pattern positioned in a corresponding location on the template surface. For instance, two sets of mask and luminescent marker patterns may be provided at opposite edges of a substrate and template surface respectively, or several may be provided distributed around the perimeter and/or at the center of the substrate and template surface respectively. In such cases, a plurality of detectors may be used and the intensities from the detectors averaged to provide an average intensity from which the aligned position may be identified by location of a turning point in the averaged intensity. Such a plurality of detectors can be, for instance, a CCD camera of which each pixel in principle can act as a radiation sensor.

The mask pattern will have features which are opaque to radiation of the first wavelength so that radiation of the first wavelength may be prevented from reaching the detector by the mask pattern.

Rough alignment of the mask pattern and luminescent marker pattern may be achieved, for instance, by use of an imaging apparatus such as a camera which can be used to provide information to position the mask pattern in rough alignment with the luminescent marker pattern prior to locating the accurately aligned position by a method described herein.

Typically, identification of the aligned position may be achieved by systematic relative displacement of the template surface and substrate surface about the roughly aligned position while measuring the intensity of detected first radiation as a function of the relative displacement of the template surface and substrate surface. The aligned position will correspond to a maximum or minimum in intensity as a function of relative position (i.e. a turning point) depending upon the relative shapes of the mask pattern and luminescent marker pattern as set out hereinafter. For instance, systematic relative displacement may be carried out in boustrophedon fashion, with the substrate moved back and forth in a raster fashion while the template is held stationary, or vice versa. Alternatively, a PID (proportional, integral, differential) controller may be used to identify the turning point in intensity by feedback of a signal proportional to intensity through the PID controller to an actuator arranged to provide relative displacement between the substrate surface and the template surface. Relative displacement may be in any direction substantially parallel to the plane of the substrate and template surfaces.

The term "luminescent" as used herein means "emitting radiation" at ambient temperatures (i.e. not including incandescent radiation generated by high temperatures). Hence a luminescent compound may include, amongst others, a fluorescent compound (emitting radiation of a first wavelength in response to excitation with a second wavelength—usually with the first wavelength being longer than the second wavelength), a phosphorescent compound (where re-radiation after excitation is delayed), radio-luminescent (with radiation emitted in response to irradiation with ionizing radiation).

The luminescent marker pattern may comprise a luminescent compound distributed thereon. For instance, a marker pattern may be formed from a compound with the luminescent compound subsequently deposited thereon. Alternatively, the luminescent compound may be distributed throughout the luminescent marker compound.

The luminescent compound is suitably a fluorescent compound emitting radiation at the first wavelength when excited by a radiation of a second wavelength, such that the luminescent marker pattern is a fluorescent marker pattern. The method then further comprises illuminating the fluorescent marker pattern with the radiation of the second wavelength. Suitably, the second wavelength should have a wavelength that is sufficiently longer than any curing actinic radiation, such as UV radiation, used for any curing of the imprintable medium, in order to avoid hardening of the resist during the alignment process.

The radiation of the second wavelength may be shone onto the fluorescent marker pattern from a direction so that it may reach the pattern without being hindered by the mask pattern, or it may pass through the mask pattern. In a suitable configuration, the radiation of the second wavelength may directed substantially normal (say within 10 degrees or 5 degrees of normal) to the substrate surface, passing through the template and the mask pattern. The emitted radiation of the first wavelength may also be collected by a detector positioned so that radiation of the first wavelength emitted substantially normal to the substrate surface (say within 10 or 5 degrees of normal) is collected by the detector. In another configuration, the second radiation may be directed towards the luminescent marker pattern at an angle to normal, such as 20 to 70°, say 45° so that it passes through an opening or openings in the mask pattern to reach the luminescent marker pattern even when the mask and luminescent marker patterns are accurately aligned. With such configurations, the template should be of a material substantially transparent or translucent to radiation of the first and second wavelengths, and the mask pattern will be opaque to the radiation of first and second wavelengths except for the openings in the mask pattern which will be substantially transparent or translucent to radiation of the first and second wavelengths.

In an embodiment, the mask pattern may be transparent or translucent to any actinic curing radiation used for curing of the imprintable medium. This may help ensure curing of the imprintable medium, even under the mask pattern.

The detector may be arranged to measure the intensity of detected radiation of the first wavelength and not of the second wavelength. For instance, a filter may be positioned between the detector and the fluorescent marker pattern, wherein the filter is arranged to permit passage of radiation of the first wavelength, and prevent passage of radiation of the second wavelength, to the detector.

The mask pattern may have substantially the same shape as the luminescent marker pattern such that the turning point is a minimum in intensity of detected first radiation at the aligned position. In other words, when the mask pattern is aligned with the luminescent marker pattern, radiation of the first wavelength will be prevented from reaching the detector by the mask pattern, so that substantially no radiation of the first wavelength will reach the detector.

In another arrangement, the mask pattern may have a complementary shape to that of the luminescent marker pattern such that the turning point is a maximum in intensity of detected first radiation at the aligned position. In other words, the mask pattern may be shaped as a negative image of the marker pattern, so that the mask pattern has a window transparent to radiation of the first wavelength such that the radiation of the first wavelength reaching the detector through the mask pattern exhibits a maximum in intensity when the mask pattern window is aligned over the luminescent marker pattern.

The accurately aligned position may be determined with imprintable medium between the fluorescent marker pattern and the mask pattern.

The luminescent compound may comprise a first functional group bonded to a second functional group provided on the substrate surface.

In an embodiment, formation of the luminescent marker pattern may comprise depositing a first liquid comprising the luminescent compound onto the substrate surface and selectively exposing the substrate surface to actinic radiation so that bonding of the first and second functional groups is induced to attach the luminescent compound to the substrate surface.

The second functional group may be provided on a primer layer deposited onto the substrate surface, with the selective exposure to actinic radiation obtained by illumination through a mask. Excess first liquid and unbonded luminescent markers may be removed, for instance by rinsing and drying the substrate surface, prior to its use for accurate alignment by a method described herein.

In an embodiment, formation of the luminescent marker pattern may comprise depositing a second liquid comprising a bridging compound onto the substrate surface and selectively exposing the substrate surface to actinic radiation such that the bridging compound is attached to the substrate surface, the bridging compound comprising the second functional group, and depositing a first liquid comprising the luminescent compound onto the substrate surface such that bonding of the first and second functional groups is induced to attach the luminescent compound to the substrate surface through the bridging compound.

The second functional group may thus be provided by the bridging compound deposited onto the substrate surface, with the selective exposure to actinic radiation obtained by illumination through a mask. Excess second liquid and unbonded bridging compound may be removed, for instance by rinsing and drying the substrate surface, prior to attachment of the luminescent compound to the substrate surface.

In an embodiment, the formation of the luminescent marker pattern comprises providing a pattern of depressions in the substrate surface, depositing a first liquid comprising the luminescent compound onto the substrate surface over the depressions, and localizing the luminescent compound into the depressions by evaporative drying of the first liquid.

For instance, the depressions may be grooves in the substrate surface formed by etching using a conventional lithography method. The luminescent compound may be localized into the depressions by the contact line between the first liquid and the substrate surface dragging the luminescent compound into the depressions as the first liquid dries for instance by evaporation.

The substrate surface may be exposed to actinic radiation, such as ultraviolet radiation, such that bonding of the first and second functional groups occurs to attach the luminescent compound to the substrate surface in the depressions.

For any of the embodiments as set out above, the first functional group may, for instance, be a thymine, isothyocyanate, carboxyl, or succimidyl ester group and the second functional group may be an amine, or vice versa. In another arrangement, the first group may be a maleimide group and the second group may be a thiol group, or vice versa.

A coating layer may be provided over the substrate surface, including over the luminescent marker pattern, after formation of the luminescent marker pattern.

For instance, the coating layer may be a bottom anti-reflection coating layer, for instance formed by spin coating.

In other words, the first aspect can provide a method of bringing a template surface and a substrate surface for imprint lithography into an aligned position, using a mask pattern of the template surface and a luminescent marker pattern of the substrate surface the method comprising bringing the fluorescent marker pattern and mask pattern into rough alignment, and bringing the fluorescent marker pattern and mask pattern into accurate alignment by positioning the mask pattern over the fluorescent marker pattern so that radiation of a first wavelength emitted from the fluorescent marker pattern is prevented from reaching a detector for the radiation of the first wavelength, so that accurate alignment of the template surface and the substrate surface is indicated.

The luminescent marker pattern is suitably a fluorescent marker pattern which emits radiation of the first wavelength in response to illumination with radiation of a second wavelength.

A second aspect provides an imprint lithography alignment apparatus comprising an actuator configured to generate relative movement between a substrate and an imprint template, the substrate having a luminescent marker pattern on a substrate surface and arranged to emit radiation of a first wavelength, and the template having a mask pattern on a template surface; a detector assembly comprising a detector configured to detect the intensity of radiation of the first wavelength emitted from the luminescent marker pattern; and a processor configured to determine an aligned position of the mask pattern and the luminescent marker pattern by identifying a turning point in the intensity of radiation of the first wavelength, emitted by the luminescent marker pattern, passing through the mask pattern and measured by the detector, as the actuator generates relative movement between the substrate and the imprint template.

The processor may be arranged to drive the actuator to bring the luminescent marker pattern and mask pattern into accurate alignment by positioning the mask pattern over the luminescent marker pattern so that radiation of the first wavelength emitted from the fluorescent marker pattern is prevented from reaching the detector, so that accurate alignment of the template surface and the substrate surface is indicated.

In an embodiment, the apparatus further comprises an imaging camera configured to allow initial coarse alignment of the substrate and the imprint template to be performed.

The actuator may be configured to move a substrate table arranged to hold the substrate, the actuator providing the relative displacement by moving the substrate table, for instance while the template remains in a fixed or stationary position.

The apparatus may further comprise a radiation source arranged to illuminate the substrate with radiation of a second wavelength so that fluorescence of radiation of the first wavelength is actuated in the luminescent (i.e. fluorescent) marker pattern.

A third aspect provides an imprint lithography apparatus comprising an imprint lithography alignment apparatus of the second aspect.

A fourth aspect provides a substrate for imprint lithography, such as device lithography, comprising a luminescent marker pattern. The substrate may comprise, or be, a semiconductor wafer. The luminescent marker pattern may be a fluorescent marker pattern.

A fifth aspect provides a method of providing a substrate surface with a luminescent marker pattern comprising: depositing a first liquid comprising a luminescent compound comprising a first functional group onto the substrate surface, the substrate surface comprising a second functional group, and selectively exposing the substrate surface to actinic radiation so as to induce bonding of the first and second functional groups to attach the luminescent compound to the substrate surface.

A sixth aspect provides a method of providing a substrate surface with a luminescent marker pattern comprising: depositing a second liquid comprising a bridging compound onto the substrate surface and selectively exposing the substrate surface to actinic radiation so that the bridging compound is attached to the substrate surface, the bridging compound comprising a second functional group, and depositing a first liquid comprising a luminescent compound comprising a first functional group onto the substrate surface so that bonding of the first and second functional groups is induced to attach the luminescent compound to the substrate surface through the bridging compound.

A seventh aspect provides a method of providing a substrate surface with a luminescent marker pattern comprising providing a pattern of depressions in the substrate surface, depositing a first liquid comprising a luminescent compound onto the substrate surface over the depressions, and localizing the luminescent compound into the depressions by evaporative drying of the first liquid. The luminescent compound suitably comprises a first functional group and the substrate surface comprises a second functional group, the method further comprising the exposing the substrate surface to actinic radiation so that bonding of the first and second functional groups occurs to attach the luminescent compound to the substrate surface in the depressions.

The luminescent compound is suitably a fluorescent compound.

The optional features set out above for the first aspect, or for other aspects, are also applicable, either individually or in combination where appropriate, to any other aspects as set out herein.

BRIEF DESCRIPTION OF THE DRAWINGS

Specific embodiments of the invention will be described with reference to the accompanying figures, in which:

FIG. 3a shows the aligned position and FIG. 3b shows a misaligned position.

DETAILED DESCRIPTION

Figure 1A:
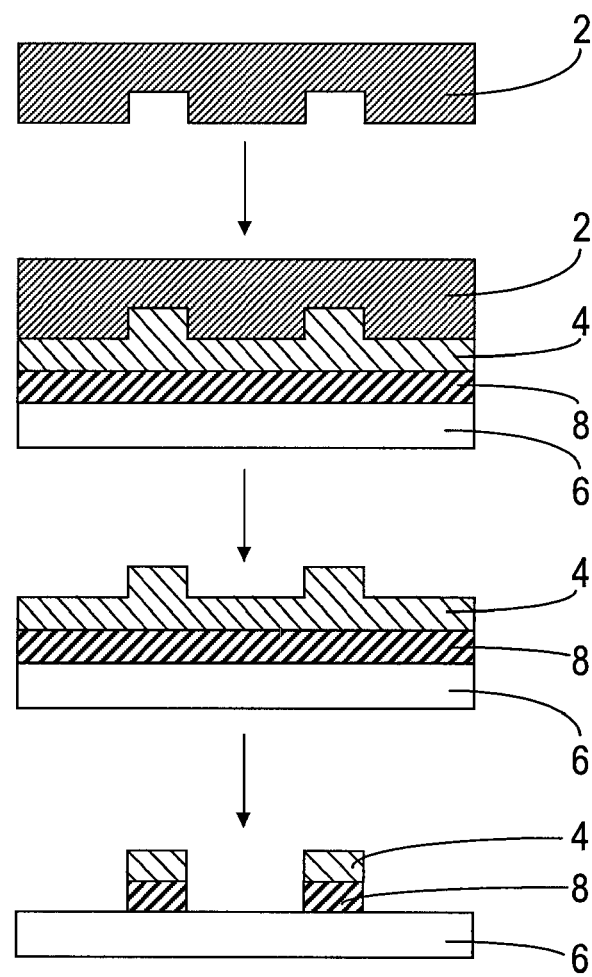
FIGS. 1a and 1b schematically depict examples of, respectively, hot imprint, and UV imprint lithography.
Figure 1B:
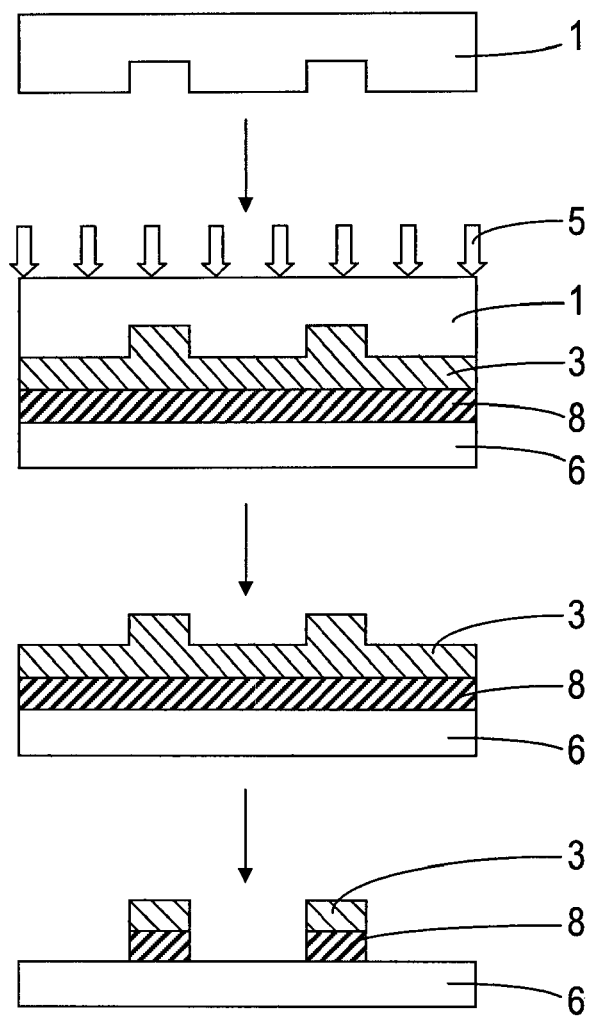

Examples of approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, a resin. The resin may, for instance, be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is imprinted into the flowable resin and then cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1B shows an example of UV imprint lithography, which involves the use of a transparent or translucent template which is transmissive to UV and a UV-curable resin as imprintable medium (the term "UV" is used here for convenience but should be interpreted as including any suitable actinic radiation for curing the imprintable medium). A UV curable resin is often less viscous than the thermosetting and thermoplastic resins used in hot imprint lithography and consequently may move much faster to fill template pattern features. A quartz template 1 is applied to a UV-curable resin 3 in a similar manner to the process of FIG. 1A. However, instead of using heat or temperature cycling as in hot imprint, the pattern is frozen by curing the imprintable medium 3 with UV radiation 5 that is applied through the quartz template 1 onto the imprintable medium 3. After removal of the template 1, the imprintable medium 3 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. US 2005-0274693, which mentions a combination of heating and UV curing an imprintable medium.

Figure 2:
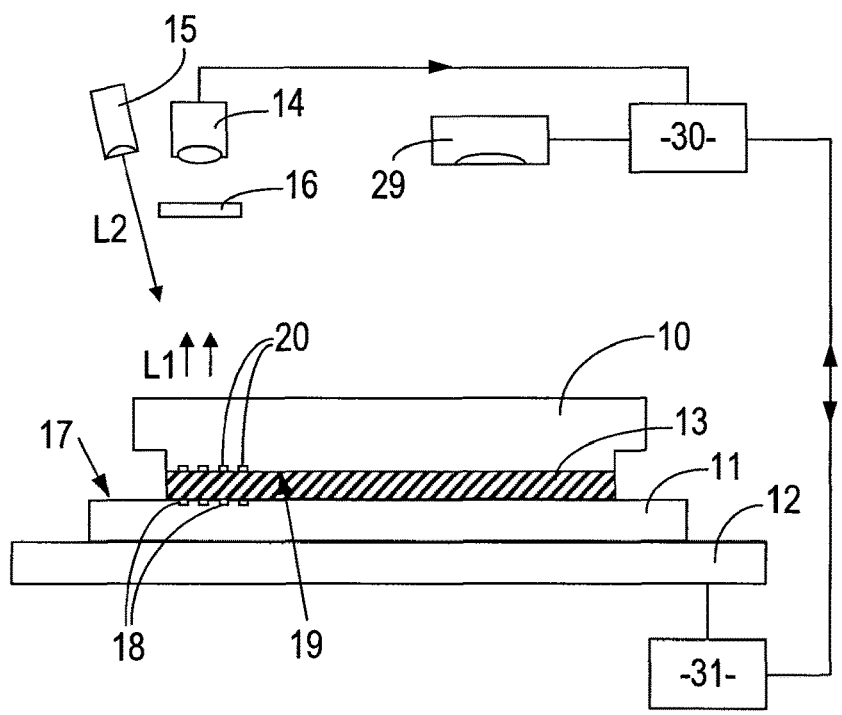
FIG. 2 shows schematically, viewed from one side in cross section, an imprint lithography alignment apparatus according to an embodiment of the invention.

FIG. 2 shows a schematic view of an imprint lithography alignment apparatus according to an embodiment of the invention and suitable for putting a method according to an embodiment of the invention into effect. The fluorescent marker pattern 18 and mask pattern 20 as shown in FIG. 2 are shown in greater detail in FIGS. 3a and 3b.

An imprint template 10 is shown positioned with a template surface 19 brought together against a substrate surface 17 of a substrate 11 mounted on a substrate table 12. A liquid imprint medium 13 is present, sandwiched between the template surface 19 and the substrate surface 17. An actuator 31 is shown schematically as operably connected to the substrate table 12 to provide relative movement between the template 10 and substrate 11 in a plane substantially parallel to the template surface 19 and substrate surface 17. The actuator is operably connected to a processor 30 which is arranged to drive the actuator in response to signals received from an alignment camera 29 and a detector 14, each schematically indicated as connected to the processor 30.

A fluorescent marker pattern 18 is provided on the substrate surface 17 with a substantially identical mask pattern 20 provided on the template surface 19.

The detector 14 is a detector adapted to detect radiation of a first wavelength L1 which is emitted by the fluorescent marker pattern 18 in response to excitation by radiation of a second wavelength L2. A radiation source 15 is arranged to direct radiation of the second wavelength L2 towards the fluorescent marker pattern 18 such that the fluorescent marker pattern 18 is excited to emit radiation of the first wavelength L1. A filter 16 which transmits radiation of the first wavelength L1 but does not transmit radiation of the second wavelength L2 is positioned between the detector 14 and the fluorescent marker pattern 18.

Figure 3A:
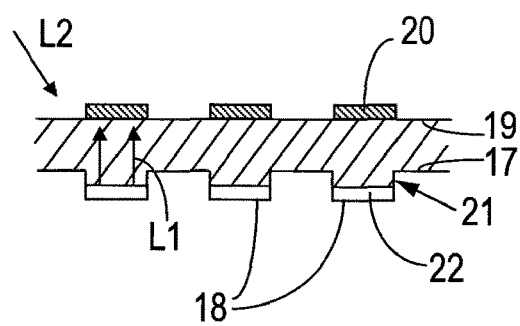
FIGS. 3a and 3b schematically show cross sectional detail of the luminescent marker pattern and mask pattern from the embodiment shown in FIG. 2.
Figure 3B:
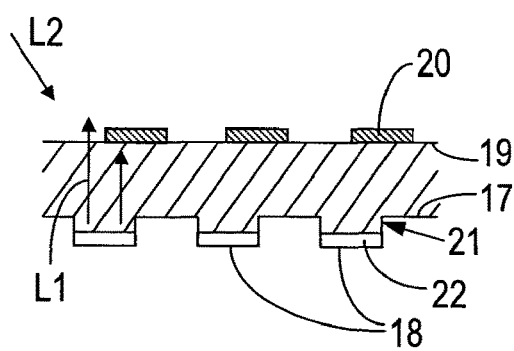

The fluorescent marker pattern 18 and mask pattern 19 are shown in detail in FIGS. 3a and 3b. Grooves 21 etched into the substrate surface 17 each hold a layer 22 comprising a fluorescent compound comprising a fluorophore moiety such as cyanine 5 which emits radiation of a first wavelength of about 670 nm in response to excitation by radiation of a second wavelength of about 650 (cyanines are more systematically referred to as a type of polymethine). Other suitable fluorophores include fluorescein based dyes (such as fluorescein), coumarin-based dyes (such as coumarin 343), oxazine based dyes (such as Nile red), and perylene-based dyes (such as Lumogen Red F300 dye). These dyes may be further provided with functional groups (such as a thymine, isothiocyanate, carboxyl, thiol, maleimide, or amine group) to bind to the substrate (optionally through a bridging compound). The surface concentration of fluorescent compound is suitably 0.1 molecules/nm$^2$ or less to reduce quenching effects. The marker pattern 20 consists of a compound opaque to the radiation of first wavelength L1 and second wavelength L2, such as a metal, deposited in grooves etched in the template surface 19. The patterns 18, 20 are substantially identical in shape and size, and in this embodiment are parallel lines 400 to 1000 nm in width, 5-20 μm in length and with the grooves having 50 nm depth. Other configurations or sizes of pattern features may be used. Any suitable pattern may be employed, for instance dots or combinations of mutually orthogonal sets of parallel lines.

In operation, with the template 10 positioned apart from the substrate 11, liquid imprint medium 13 is deposited onto the substrate surface 17 (for instance by ink-jet printing). The template and substrate are brought together into coarse alignment using the imaging camera 29 to provide alignment information to processor 30 to drive actuator 31 to position the substrate table 12. The substrate surface 17 and template surface 18 are then squeezed together to squeeze the liquid imprint medium 13 between them ready for subsequent performance of imprint lithography following accurate alignment using the method described herein. During squeezing the coarse alignment is followed continuously.

Accurate alignment is achieved using the method described herein prior to conducting imprint lithography using the liquid imprint medium 13.

Turning to FIGS. 3a and 3b, it can be seen from FIG. 3b that when the fluorescent marker pattern 18 and mask pattern 20 are slightly misaligned, as shown in this FIG. 3b, radiation of first wavelength L1, excited by radiation of second wavelength L2, will pass through mask pattern 20 and subsequently through filter 16 to be detected at detector 14 sending a signal to processor 30. In FIG. 3a, where the patterns 18 and 20 are in accurate alignment, radiation of first wavelength L1, even if exited by radiation of second wavelength L2, is blocked by mask pattern 20 and substantially cannot reach detector 14.

Hence, processor 30 is programmed to adjust the relative position of template 10 and substrate 11 using actuator 31 to drive substrate table 12 (and/or to drive template 11) while monitoring the signal from detector 14, and is able to identify the accurately aligned position, as shown in FIG. 3a, by locating the relative position in which the detected signal is a minimum. Any slight misalignment will allow more radiation of first wavelength L1 to pass the mask pattern and be detected at detector 14.

In operation, an embodiment of the invention provides at least one advantage over a conventional imprint lithography alignment apparatus and methods in that it generates the radiation needed for detecting the alignment at the spot where it is needed, namely at the alignment mark itself. The radiation is generated by a fluorophore, in molecules of sub-nanometer size. The accuracy is determinable by the choice of the marker pattern and the design of the layout of the marker pattern—for instance parallel lines, circles, or a linear pattern with mutually perpendicular lines. Therefore it does not require a detector which is dedicated to alignment in the x-direction and a separate detector which is dedicated to alignment in the y-direction, but instead uses a single intensity detector to achieve alignment in the x and y directions (the terms x- and y- refer to arbitrary Cartesian co-ordinates within the plane parallel to the template/substrate surfaces). The detector 14 may be a non-imaging detector. The detector 14 thus does not necessarily detect an image of the mask pattern or luminescent marker pattern, but merely detects the intensity of alignment radiation which is incident upon the detector. Since the intensity detector 14 may be a non-imaging detector and provide a single output (the intensity signal), analysis of the output of the intensity detector by the processor 30 may be relatively straightforward and robust (compared with analysis of an image). For instance, the detector 14 may be a photodiode, a CCD (charge-coupled device) camera or any other suitable detection apparatus.

The aligned position of more than one luminescent marker pattern and associated mask pattern may be performed before imprint lithography is effected. This may be performed, for example, using a separate detector for each pair of patterns. For instance, the template 10 may be square or rectangular, and provided with marker patterns at or adjacent to each corner. For instance, the template may be circular or oval in shape, with marker patterns evenly distributed around its perimeter. Corresponding luminescent/fluorescent marker patterns may be provided on the substrate surface. The information from alignment patterns distributed over the imprint area may be used for magnification correction.

Although the surface density of the luminescent/fluorescent molecules may be so low (for instance to avoid self-quenching effects) that the luminescent/fluorescent marker pattern exhibits substantial line edge roughness, such roughness is averaged over relatively long edges, and so the alignment accuracy for the method may be considerably better than might be expected from the line edge roughness.

Once alignment has been completed, the imprintable medium located between the imprint template and the substrate is then hardened, for example by exposing it to UV radiation. Any suitable method of hardening the imprintable medium may be used, including the methods described further above. The imprint template 10 may then come out of contact with the imprintable medium, and the substrate 11 moved laterally (and/or the template is moved laterally) so that the imprint template is above a different part of the substrate. Alignment of the imprint template 16 and the substrate 22 may then be repeated, for instance using different patterns, following which the imprintable medium beneath the imprint template may again be hardened.

In the embodiment set out above, the substrate 11 is moved relative to the imprint template 10 to effect accurate alignment in accordance with the method. Alternatively or additionally, the imprint template may be moved relative to the substrate.

The imprint template 10 may be held in an imprint template holder (not illustrated).

The template may have, for example, a patterned area for imprint lithography on the template surface 19 (not shown in FIG. 2 or 3) which measures 25×25 mm or 26×32 mm, or may have a patterned area with some other suitable dimensions.

The template surface 19 may be provided with a single pattern, which for example forms a layer of a single integrated circuit. Alternatively, the template surface 19 may be provided with multiple patterns, which for example each form a layer of an integrated circuit. In an embodiment, the template may be sufficiently large to imprint a pattern onto the entire substrate during a single imprint.

The described and illustrated embodiment is to be considered as illustrative and not restrictive in character, it being understood that only a preferred embodiment has been shown and described and that all changes and modifications that come within the scope of the inventions as defined in the claims are desired to be protected.

Although FIGS. 2 and 3 show a particular apparatus according to an embodiment of the invention, other apparatus may be used. For example, the apparatus may be modified by placing the detector 14 in a different location.

In an embodiment the radiation source 15, detector 14, processor 30, etc. may be moveable, and may be relocated away from the template after accurate alignment has been completed. A moveable stage may be used to allow this movement to take place. This relocation allows UV radiation to be directed more easily onto the imprintable medium 13 (for example if UV imprint lithography is being used).

Embodiments of the invention may omit non-essential components, such as the filter 16.

In an embodiment, the substrate surface may be covered, for instance, with a top coat or a so-called BARC (Bottom Anti Reflection Coating) layer. In other embodiments, the marker pattern may be a luminescent marker pattern rather than a fluorescent marker pattern. In other embodiments, the fluorescent marker pattern may formed by use of fluorescent compound chemically bonded to a non-fluorescent preliminary marker pattern provided with reactive functional groups arranged to bond the fluorescent compound to the substrate surface. The luminescent marker pattern and/or the mask pattern may be provided using conventional optical/UV lithography methods.

When a bridging compound is used, as set out hereinbefore, in order to bond a luminescent compound to the substrate surface to form a luminescent/fluorescent marker pattern, this may provide an advantage that any chromophore or fluorophore prone to bleaching over time may be attached only at a late stage in the process of formation of the marker pattern and after any UV exposure required to form the marker pattern, so that such bleaching is reduced or eliminated.

The present invention relates to an imprint lithography apparatus and method. The apparatus and/or method may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as planarization layers or anti-reflection coating layers.

In this specification, the term "comprising" applied to a component means including that component, but not necessarily to the exclusion of other components. The term "consisting essentially" applied to one or more components means that other components other than impurities, or minor components not contributing to the technical effect of the invention, are substantially excluded. Typically this will mean that for a chemical composition, less than 5%, typically less than 1% by weight of other components will be present. For the avoidance of doubt, the use of the term "comprising" in this specification, in addition to the meaning set out above, also includes the narrower meaning of "consisting essentially".

In the above embodiments, a single imprint template, a single imprint template holder, a single substrate table and a single substrate is provided in a single chamber. In other embodiments, more than one imprint template, more than one imprint template holder, more than one substrate table, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate tables. In an embodiment, there is provided an apparatus that includes a plurality (e.g. 2, 3, 4, 5, 6, 7 or 8 or more) of imprint templates. In an embodiment, there is provided an apparatus configured to use one template holder arrangement per substrate table. In an embodiment, there is provided an apparatus configured to use more than one template holder arrangement per substrate table. In an embodiment, there is provided an apparatus that includes a plurality (e.g. 2, 3, or 4) of imprintable medium dispensers. In an embodiment, there is provided an apparatus configured to use one imprintable medium dispenser per substrate table. In an embodiment, there is provided an apparatus configured to use one imprintable medium dispenser per imprint template arrangement. In an embodiment, where an apparatus is provided that includes a plurality of substrate tables, the substrate tables may share functionalities in the apparatus. For instance, the substrate tables may share a substrate handler, a substrate cassette, a gas supply system (e.g. to create a helium environment during imprinting), an imprintable medium dispenser, and/or a radiation source (for curing the imprintable medium). In an embodiment, two or more of the substrate tables (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate tables.

Further embodiments according to the invention are provided in below numbered clauses:

1. A method of aligning a template and a substrate for imprint lithography using a mask pattern of the template and a luminescent marker pattern of the substrate, the method comprising:

aligning the mask pattern and the luminescent marker pattern using a radiation intensity measurement of radiation emitted by the luminescent marker pattern and having passed the mask pattern.

2. The method of clause 1, wherein the luminescent marker pattern is on a substrate surface and the mask pattern is on a template surface, and comprising:

bringing the template surface and substrate surface together, with the template surface and substrate surface substantially mutually parallel to a plane, so that first radiation emitted from the luminescent marker pattern is arranged to pass through the mask pattern to a detector configured to measure intensity of detected first radiation, and adjusting relative displacement between the template surface and substrate surface to an aligned position by identification of a turning point in the intensity of detected first radiation as a function of the relative displacement between the template surface and substrate surface at the aligned position, wherein the mask pattern and the luminescent marker pattern are each shaped to provide a turning point in the intensity of detected first radiation as a function of relative displacement at the aligned position.

3. The method of clause 1 or clause 2, wherein the luminescent marker pattern and the mask pattern are first roughly aligned by imaging and then identification of the turning point is obtained by measuring the intensity of detected first radiation as a function of the relative displacement between the template surface and substrate surface as the template surface and/or substrate surface are moved relative to each other, substantially parallel to the plane, by an actuator.

4. The method of any preceding clause, wherein the luminescent marker pattern comprises a luminescent compound distributed thereon.

5. The method of any preceding clause, wherein the luminescent compound is a fluorescent compound emitting radiation at a first wavelength when excited by a radiation of a second wavelength, such that the luminescent marker pattern is a fluorescent marker pattern, and the method further comprising illuminating the fluorescent marker pattern with the radiation of the second wavelength.

6. The method of clause 5, wherein a detector is arranged to measure the intensity of detected radiation of the first wavelength and not of the second wavelength.

7. The method of clause 6, wherein a filter is positioned between the detector and the fluorescent marker pattern, the filter arranged to permit passage of radiation of the first wavelength and prevent passage of radiation of the second wavelength, to the detector.

8. The method of any preceding clause, wherein the mask pattern has substantially the same shape as the luminescent marker pattern such that a turning point in the intensity of detected first radiation as a function of the relative displacement between the template surface and substrate surface at the aligned position is a minimum in intensity of detected first radiation at the aligned position.

9. The method of any of clauses 1 to 7, wherein the mask pattern has a complementary shape to that of the luminescent marker pattern such that a turning point in the intensity of detected first radiation as a function of the relative displacement between the template surface and substrate surface at the aligned position is a maximum in intensity of detected first radiation at the aligned position.

10. The method of any preceding clause, wherein the accurately aligned position is determined with imprintable medium between the fluorescent marker pattern and the mask pattern.

11. The method of any preceding clause, wherein a luminescent compound of the luminescent marker pattern comprises a first functional group bonded to a second functional group provided on the substrate surface.

12. The method of clause 11, wherein formation of the luminescent marker pattern comprises depositing a first liquid comprising the luminescent compound onto the substrate surface and selectively exposing the substrate surface to actinic radiation such that bonding of the first and second functional groups is induced to attach the luminescent compound to the substrate surface.

13. The method of clause 11, wherein formation of the luminescent marker pattern comprises depositing a second liquid comprising a bridging compound onto the substrate surface and selectively exposing the substrate surface to actinic radiation such that the bridging compound is attached to the substrate surface, the bridging compound comprising the second functional group, and depositing a first liquid comprising the luminescent compound onto the substrate surface such that bonding of the first and second functional groups is induced to attach the luminescent compound to the substrate surface through the bridging compound.

14. The method of clause 11, wherein formation of the luminescent marker pattern comprises providing a pattern of depressions in the substrate surface, depositing a first liquid comprising the luminescent compound onto the substrate surface over the depressions, and localizing the luminescent compound into the depressions by evaporative drying of the first liquid.

15. The method of clause 14, further comprising the exposing the substrate surface to actinic radiation so that bonding of the first and second functional groups occurs to attach the luminescent compound to the substrate surface in the depressions.

16. The method of any of the preceding clauses, wherein a coating layer is provided over the substrate surface, including over the luminescent marker pattern, after formation of the luminescent marker pattern.

17. The method of clause 16, wherein the coating layer comprises a bottom anti-reflection coating layer.

18. A method of bringing a template surface and a substrate surface for imprint lithography into an aligned position, using a mask pattern of the template surface and a luminescent marker pattern of the substrate surface, the method comprising:

bringing the luminescent marker pattern and mask pattern into rough alignment, and bringing the luminescent marker pattern and mask pattern into accurate alignment by positioning the mask pattern over the luminescent marker pattern so that radiation of a first wavelength emitted from the luminescent marker pattern is prevented from reaching a detector for the radiation of the first wavelength, so that accurate alignment of the template surface and the substrate surface is indicated.

19. The method of clause 18, wherein the luminescent marker pattern is a fluorescent marker pattern which emits radiation of the first wavelength in response to illumination with radiation of a second wavelength.

20. An imprint lithography alignment apparatus comprising:

an actuator configured to generate relative movement between a substrate and an imprint template, the substrate having a luminescent marker pattern on a substrate surface and arranged to emit radiation of a first wavelength, and the template having a mask pattern on a template surface;

a detector assembly comprising a detector configured to detect the intensity of radiation of the first wavelength emitted from the luminescent marker pattern; and a processor configured to determine an aligned position of the mask pattern and the luminescent marker pattern by identifying a turning point in the intensity of radiation of the first wavelength, emitted by the luminescent marker pattern, passing through the mask pattern and measured by the detector, as the actuator generates relative movement between the substrate and the imprint template.

21. The apparatus of clause 20, wherein the processor is arranged to drive the actuator to bring the luminescent marker pattern and mask pattern into accurate alignment by positioning the mask pattern over the luminescent marker pattern so that radiation of a first wavelength emitted from the fluorescent marker pattern is prevented from reaching the detector, so that accurate alignment of the template surface and the substrate surface is indicated.

22. The apparatus of clause 20 or clause 21, further comprising an imaging camera configured to allow initial coarse alignment of the substrate and the imprint template to be performed.

23. The apparatus of any of clauses 20 to 22, wherein the actuator is configured to move a substrate table arranged to hold the substrate, the actuator providing the relative displacement by moving the substrate table.

24. The apparatus of any of clauses 20 to 23, further comprising a radiation source arranged to illuminate the substrate with radiation of a second wavelength.

25. An imprint lithography apparatus comprising the imprint lithography alignment apparatus according of any of clauses 20 to 24.

26. A substrate for imprint lithography comprising a luminescent marker pattern.

27. The substrate according to clause 26, wherein the substrate comprises a semiconductor wafer.

28. The substrate according to clause 26 or clause 27, wherein the luminescent marker pattern is a fluorescent marker pattern.

29. A method of providing a substrate surface with a luminescent marker pattern comprising:

depositing a first liquid comprising a luminescent compound comprising a first functional group onto the substrate surface, the substrate surface comprising a second functional group, and selectively exposing the substrate surface to actinic radiation so that bonding of the first and second functional groups is induced to attach the luminescent compound to the substrate surface.

30. A method of providing a substrate surface with a luminescent marker pattern comprising:

depositing a second liquid comprising a bridging compound onto the substrate surface and selectively exposing the substrate surface to actinic radiation so that the bridging compound is attached to the substrate surface, the bridging compound comprising a second functional group, and depositing a first liquid comprising a luminescent compound comprising a first functional group onto the substrate surface so that bonding of the first and second functional groups is induced to attach the luminescent compound to the substrate surface through the bridging compound.

31. A method of providing a substrate surface with a luminescent marker pattern comprising providing a pattern of depressions in the substrate surface, depositing a first liquid comprising a luminescent compound onto the substrate surface over the depressions, and localizing the luminescent compound into the depressions by evaporative drying of the first liquid.

32. The method of clause 31 wherein the luminescent compound comprises a first functional group and the substrate surface comprises a second functional group, the method further comprising the exposing the substrate surface to actinic radiation so that bonding of the first and second functional groups occurs to attach the luminescent compound to the substrate surface in the depressions.

33. The method of any of clauses 29 to 32, wherein the luminescent compound is a fluorescent compound.

The invention claimed is:

1. A method of aligning a template and a substrate for imprint lithography using a mask pattern of the template and a luminescent marker pattern of the substrate, the method comprising:

providing radiation through an aperture of the mask pattern toward the luminescent marker pattern, the radiation incident to the mask pattern at a non-orthogonal angle to the mask pattern; and aligning the mask pattern and the luminescent marker pattern using a radiation intensity measurement of radiation emitted by the luminescent marker pattern and having passed the aperture of the mask pattern, wherein at least part of the radiation emitted by the luminescent marker pattern is blocked by the mask pattern.

2. The method of claim 1, wherein the luminescent marker pattern is on a substrate surface and the mask pattern is on a template surface, and comprising:

bringing the template surface and substrate surface together, with the template surface and substrate surface substantially mutually parallel to a plane, so that first radiation emitted from the luminescent marker pattern is arranged to pass through the mask pattern to a detector configured to measure intensity of detected first radiation, and adjusting relative displacement between the template surface and substrate surface to an aligned position by identification of a turning point in the intensity of detected first radiation as a function of the relative displacement between the template surface and substrate surface at the aligned position, wherein the mask pattern and the luminescent marker pattern are each shaped to provide a turning point in the intensity of detected first radiation as a function of relative displacement at the aligned position.

3. The method of claim 1, wherein the luminescent marker pattern and the mask pattern are first roughly-aligned by imaging and then identification of the turning point is obtained by measuring the intensity of detected first radiation as a function of the relative displacement between the template surface and substrate surface as the template surface and/or substrate surface are moved relative to each other, substantially parallel to the plane, by an actuator.

4. The method of claim 1, wherein the luminescent marker pattern comprises a luminescent compound distributed thereon.

5. The method of claim 1, wherein the luminescent compound is a fluorescent compound emitting radiation at a first wavelength when excited by a radiation of a second wavelength, such that the luminescent marker pattern is a fluorescent marker pattern, and the method further comprising illuminating the fluorescent marker pattern with the radiation of the second wavelength.

6. The method of claim 5, wherein a detector is arranged to measure the intensity of detected radiation of the first wavelength and not of the second wavelength.

7. The method of claim 6, wherein a filter is positioned between the detector and the fluorescent marker pattern, the filter arranged to permit passage of radiation of the first wavelength and prevent passage of radiation of the second wavelength, to the detector.

8. A method of aligning a template and a substrate for imprint lithography using a mask pattern of the template and a luminescent marker pattern of the substrate, the method comprising:
aligning the mask pattern and the luminescent marker pattern using a radiation intensity measurement of radiation, emitted by the luminescent marker pattern, having passed the aperture of the mask pattern,
wherein the luminescent compound is a fluorescent compound emitting radiation at a first wavelength when excited by a radiation of a second wavelength, such that the luminescent marker pattern is a fluorescent marker pattern, and the method further comprising illuminating the fluorescent marker pattern with the radiation of the second wavelength, the radiation incident to the fluorescent marker pattern at a non-orthogonal angle to the fluorescent marker pattern,
wherein a detector is arranged to measure the intensity of detected radiation, and
wherein a filter is positioned between the detector and the fluorescent marker pattern, the filter arranged to permit passage of radiation of the first wavelength and prevent passage of radiation of the second wavelength, to the detector.

9. The method of claim 1, wherein a luminescent compound of the luminescent marker pattern-comprises a first functional group bonded to a second functional group provided on the substrate surface.

10. The method of claim 9, wherein formation of the luminescent marker pattern comprises depositing a first liquid comprising the luminescent compound onto the substrate surface and selectively exposing the substrate surface to actinic radiation such that bonding of the first and second functional groups is induced to attach the luminescent compound to the substrate surface.

11. The method of claim 9, wherein formation of the luminescent marker pattern comprises
depositing a second liquid comprising a bridging compound onto the substrate surface and selectively exposing the substrate surface to actinic radiation such that the bridging compound is attached to the substrate surface, the bridging compound comprising the second functional group, and
depositing a first liquid comprising the luminescent compound onto the substrate surface such that bonding of the first and second functional groups is induced to attach the luminescent compound to the substrate surface through the bridging compound.

12. The method of claim 9, wherein formation of the luminescent marker pattern comprises providing a pattern of depressions in the substrate surface, depositing a first liquid comprising the luminescent compound onto the substrate surface over the depressions, and localizing the luminescent compound into the depressions by evaporative drying of the first liquid.

13. A method of bringing a template surface and a substrate surface for imprint lithography into an aligned position, using a mask pattern of the template surface and a luminescent marker pattern of the substrate surface, the method comprising:
bringing the luminescent marker pattern and mask pattern into rough alignment;
providing radiation through an aperture of the mask pattern toward the luminescent marker pattern, the radiation incident to the mask pattern at a non-orthogonal angle to the mask pattern; and
bringing the luminescent marker pattern and mask pattern into accurate alignment by positioning the mask pattern over the luminescent marker pattern so that radiation of a first wavelength emitted from the luminescent marker pattern passes through the aperture of the mask pattern toward a detector for the radiation of the first wavelength and radiation of the first wavelength emitted from the luminescent marker pattern is prevented from reaching the detector for the radiation of the first wavelength by the mask pattern, so that accurate alignment of the template surface and the substrate surface is indicated.

14. The method of claim 13, wherein the luminescent marker pattern is a fluorescent marker pattern which emits radiation of the first wavelength in response to illumination with radiation of a second wavelength.

15. The method of claim 14, wherein the detector is arranged to measure the intensity of detected radiation of the first wavelength and not of the second wavelength.

16. The method of claim 14, wherein a filter is positioned between the detector and the fluorescent marker pattern, the filter arranged to permit passage of radiation of the first wavelength and prevent passage of radiation of the second wavelength, to the detector.

17. The method of claim 14, wherein a luminescent compound of the luminescent marker pattern comprises a first functional group bonded to a second functional group provided on the substrate surface.

18. The method of claim 17, wherein formation of the luminescent marker pattern comprises depositing a first liquid comprising the luminescent compound onto the substrate surface and selectively exposing the substrate surface to actinic radiation such that bonding of the first and second functional groups is induced to attach the luminescent compound to the substrate surface.

19. The method of claim 17, wherein formation of the luminescent marker pattern comprises
depositing a second liquid comprising a bridging compound onto the substrate surface and selectively exposing the substrate surface to actinic radiation such that the bridging compound is attached to the substrate surface, the bridging compound comprising the second functional group, and
depositing a first liquid comprising the luminescent compound onto the substrate surface such that bonding of the first and second functional groups is induced to attach the luminescent compound to the substrate surface through the bridging compound.

20. The method of claim 17, wherein formation of the luminescent marker pattern comprises providing a pattern of depressions in the substrate surface, depositing a first liquid comprising the luminescent compound onto the substrate surface over the depressions, and localizing the luminescent compound into the depressions by evaporative drying of the first liquid.

* * * * *